(12) United States Patent
Sweeney et al.

(10) Patent No.: US 10,304,608 B2
(45) Date of Patent: May 28, 2019

(54) FIELD REGULATOR

(71) Applicant: MINE SITE TECHNOLOGIES PTY LTD, North Ryde (AU)

(72) Inventors: Peter John Sweeney, North Ryde (AU); Martin Christopher Wildt, North Ryde (AU)

(73) Assignee: Mine Site Technologies Pty Ltd (AU)

( * ) Notice: Subject to any disclaimer, the term of this patent is extended or adjusted under 35 U.S.C. 154(b) by 10 days.

(21) Appl. No.: 15/303,718

(22) PCT Filed: Apr. 16, 2015

(86) PCT No.: PCT/AU2015/050179
§ 371 (c)(1),
(2) Date: Oct. 12, 2016

(87) PCT Pub. No.: WO2015/157824
PCT Pub. Date: Oct. 22, 2015

(65) Prior Publication Data
US 2017/0032878 A1  Feb. 2, 2017

(30) Foreign Application Priority Data
Apr. 17, 2014 (AU) ................................ 2014901423

(51) Int. Cl.
*H01F 19/04* (2006.01)
*H01F 27/24* (2006.01)
(Continued)

(52) U.S. Cl.
CPC ........... *H01F 19/04* (2013.01); *G01D 5/2006* (2013.01); *H01F 27/24* (2013.01); *H01F 27/28* (2013.01);
(Continued)

(58) Field of Classification Search
CPC .......... H01F 19/04; H01F 27/28; H01F 27/24; H01F 21/08; H03K 3/017; H03K 17/954;
(Continued)

(56) References Cited

U.S. PATENT DOCUMENTS 4,035,710 A * 7/1977 Joyce .................... H02M 3/156
                                                              323/266
4,853,611 A   8/1989 Kislovski
(Continued)

OTHER PUBLICATIONS

International Search Report and Written Opinion prepared by the Australian Patent Office dated Jun. 5, 2015, for International Application No. PCT/AU2015/050179.
(Continued)

*Primary Examiner* — Huy Q Phan
*Assistant Examiner* — Zannatul Ferdous
(74) *Attorney, Agent, or Firm* — Sheridan Ross P.C.

(57) ABSTRACT

The invention generally relates to a field regulator, particularly a field regulator for a resonant circuit, a transmitter including such a field regulator, a proximity detection system including such a transmitter, and a method of regulating a resonant circuit. In one aspect the invention provides a field regulator for a resonant circuit, the resonant circuit including an inductor coil around a core, the field regulator including a DC bias circuit configured to apply a DC bias current to the inductor coil for regulating an electromagnetic field generated by the inductor. The DC bias circuit can be used to selectively change the inductance of the inductor in the resonant circuit so as to maintain a consistent field strength in a changing environment, particularly to take into account the presence of large metal bodies which might otherwise adversely impact on operation. In particular, the DC bias current may be used to selectively change the natural frequency of the resonant circuit so as to shift the resonant circuit towards a desired resonance point.

17 Claims, 4 Drawing Sheets

(51) Int. Cl.
    *H01F 27/28*         (2006.01)
    *H03K 17/95*         (2006.01)
    *G01D 5/20*          (2006.01)
    *H03K 3/017*         (2006.01)
    *H01F 21/08*         (2006.01)
    *H02M 7/5387*       (2007.01)
    *H02M 7/48*          (2007.01)

(52) U.S. Cl.
    CPC ........... *H03K 3/017* (2013.01); *H03K 17/954* (2013.01); *H01F 21/08* (2013.01); *H02M 7/5387* (2013.01); *H02M 2007/4818* (2013.01); *Y02B 70/1441* (2013.01)

(58) Field of Classification Search
    CPC ............. G01D 5/2006; Y02B 70/1441; H02M 2007/4818; H02M 7/5387
    See application file for complete search history.

(56) References Cited

U.S. PATENT DOCUMENTS

| | | | | |
|---|---|---|---|---|
| 4,992,919 A * | 2/1991 | Lee | ..................... | H02M 3/3376 363/132 |
| 5,684,678 A * | 11/1997 | Barrett | .................... | H01F 21/08 363/17 |
| 8,120,457 B2 * | 2/2012 | Hu | .......................... | H01F 29/14 336/178 |
| 2010/0061123 A1 * | 3/2010 | Jansen | ............. | H02M 3/33507 363/21.02 |
| 2010/0328967 A1 * | 12/2010 | Cody | ................ | H02M 3/33592 363/21.02 |
| 2011/0248812 A1 | 10/2011 | Hu et al. | | |
| 2011/0305047 A1 * | 12/2011 | Jungreis | .................. | H02M 1/08 363/21.02 |
| 2014/0346962 A1 * | 11/2014 | Sanders | ............. | H05B 33/0815 315/193 |
| 2015/0029758 A1 * | 1/2015 | Jacobson | .......... | H02M 3/33576 363/17 |
| 2017/0373395 A9 * | 12/2017 | Rokhsaz | ................ | H01Q 7/005 |

OTHER PUBLICATIONS

International Preliminary Report on Patentability prepared by the Australian Patent Office dated Feb. 17, 2016, for International Application No. PCT/AU2015/050179.

Jiang et al, "Magnetic Field Distribution of a Novel Variable Inductor Based on Orthogonal Magnetization." PIERS Proceedings, Cambridge, USA, Jul. 5-8, 2010.

* cited by examiner

FIELD REGULATOR

CROSS REFERENCE TO RELATED APPLICATIONS

This application is a national stage application under 35 U.S.C. 371 and claims the benefit of PCT Application No. PCT/AU2015/050179 having an international filing date of 16 Apr. 2015, which designated the United States, which PCT application claimed the benefit of Australian Patent Application No. 2014901423 filed 17 Apr. 2014, the disclosure of each of which are incorporated herein by reference.

FIELD OF THE INVENTION

The invention generally relates to a field regulator, particularly a field regulator for a resonant circuit, a transmitter including such a field regulator, a proximity detection system including such a transmitter, and a method of regulating a resonant circuit.

BACKGROUND OF THE INVENTION

Many work sites, such as engineering work sites and materials handling sites that involve the operation and movement of vehicles, equipment and machinery (for example, trucks, cranes, tractors, forklifts, conveyors, diggers, crushers, underground mining equipment and the like) often require special measures to minimise risk of injury and other damage, and to meet particular safety requirements.

The prior art includes warning systems such as proximity detection and collision avoidance systems that have been developed to assist workers or equipment operators to detect the proximity of another worker or machinery so as to avoid collision.

Some proximity detection systems use radio communication in which an electromagnetic field generated by a transmitter can be detected by receivers (carried by personnel) when the receivers are within a predetermined range of the transmitter. This allows measures to be taken to avoid collision or accident.

However, the strength and therefore the range of the electromagnetic field generated by a transmitter can be affected by factors of its operating environment. For example, the signals from one transmitter can sometimes interfere with the signals from one or more other transmitters. Moreover, metal objects in an operating environment can have the effect of significantly altering the circuit inductance and hence the resonant frequency of the transmitter, thereby affecting the strength of the electromagnetic field generated by the transmitter.

In addition, changes in material properties of the circuitry components, such as changes in properties of dielectric, insulation, conductor and inductor core materials can occur, for example, as the circuitry components deteriorate with age and use, and/or become affected by temperature, pressure, humidity and other environmental variables.

These factors have had the effect of limiting the effectiveness of existing proximity detection systems in some work places. The electromagnetic field generated by these proximity detection systems can be weak, unreliable, and/or prone to interruption or interference.

In transmitters used in existing proximity detection systems, it is known to use a variable inductor or a variable capacitor to compensate for any changes in the performance of the transmitter during set up and operation in a particular environment. These variable inductors and capacitors are typically adjusted by manual control or using a servomechanism. These solutions either involve field intervention, or introduce additional complexity and consequent expense and risk.

The present invention aims to address at least in part one or more of the disadvantages or problems described above, or at least to provide the industry with a useful choice.

In this specification, where a document, act or item of knowledge is referred to or discussed, such a reference or discussion is not an admission that the document, act or item of knowledge or any combination thereof was at the priority date part of common general knowledge, or known to be relevant to an attempt to solve any problem with which this specification is concerned.

SUMMARY OF THE INVENTION

According to one aspect of the invention, there is provided a field regulator for a resonant circuit, the resonant circuit including an inductor coil around a core, the field regulator including a DC bias circuit configured to apply a DC bias current to the inductor coil for regulating an electromagnetic field generated by the inductor.

The DC bias circuit can be used to selectively change the inductance of the inductor in the resonant circuit so as to maintain a consistent field strength. In particular, the DC bias current may be used to selectively change the natural frequency of the resonant circuit so as to shift the resonant circuit towards a desired resonance point.

The variation in inductance is achieved without the need for an additional control winding, by directly superimposing the DC bias current on the resonant circuit inductor.

Preferably, the field regulator includes a feedback control system in which the level of the applied DC bias current is determined based on a current measured in the resonant circuit.

The field regulator therefore preferably includes:
a current detector for detecting a current flow of the resonant circuit, and
a bias current controller for controlling the DC bias current based on the detected current flow of the resonant circuit.

A variation of the DC bias current may have the effect of modulating the resonant circuit response characteristics around a nominal circuit response point, and this can be used for adjusting the circuit resonance point to a target resonance point.

To this end, the field regulator may be configured to adjust the DC bias current based on a resonant circuit response to an incremental change in the DC bias current. In particular, the bias current controller may be configured to adjust the DC bias current based on a detected change in the current flow of the resonant circuit in response to an incremental change in the DC bias current.

The bias current controller may be configured to reduce the DC bias current in response to a determination that the current flow of the resonant circuit decreases in response to an incremental increase in the DC bias current, and/or that the current flow of the resonant circuit increases in response to an incremental decrease in the DC bias current.

Further, the bias current controller may be configured to increase the DC bias current in response to a determination that the current flow of the resonant circuit increases in response to an incremental increase in the DC bias current, and/or that the current flow of the resonant circuit decreases in response to an incremental decrease in the DC bias current.

In theory, an increase in the current flow of the resonant circuit in response to an incremental increase in the DC bias current, and/or a decrease in the current flow of the resonant circuit in response to an incremental decrease in the DC bias current may indicate that the natural frequency is lower than the driving frequency of the resonant circuit. Conversely, a decrease in the current flow of the resonant circuit in response to an incremental increase in the DC bias current, and/or an increase in the current flow of the resonant circuit in response to an incremental decrease in the DC bias current may indicate that the natural frequency is higher than the driving frequency of the resonant circuit.

The current detector preferably includes a current sensing resistor. In some embodiments, the current detector may include a hall effect device, a magnetic detection coil, or the like. The current detector may sample the current flow of the resonant circuit at regular intervals. In some embodiments, the current detector may continuously detect the current flow of the resonant circuit. The bias current controller may determine a current flow of the resonant circuit by calculating an average value of the samples. Typically, the current detector is timed to sample the peak value of the current flow.

The bias current controller may be optionally coupled to a resonant circuit controller which controls an alternating power supply to said resonant circuit. The bias current controller may determine appropriate sampling times based on information from the resonant circuit controller.

The resonant circuit controller may include an H-bridge controller for controlling a driving frequency for driving the resonant circuit. Typically, the H-bridge controller includes a microprocessor for determining a driving frequency of the H-bridge.

The DC bias current source is preferably decoupled from high voltages of the resonant circuit. In a preferred embodiment, the field regulator includes one or more AC blocking inductors for decoupling the DC bias current source from voltages of the resonant circuit. Any suitable number of blocking inductors can be used. Preferably the field regulator includes a pair of blocking inductors connected between the resonant circuit and the DC bias current source. In particular, a blocking inductor may be connected to each terminal of the DC source. More particularly, the inductance value of each blocking inductor may be at least an order of magnitude greater than that of the inductor of the resonant circuit. According to another aspect of the invention, there is provided a transmitter including:

a resonant circuit including an inductor coil around a core, and a field regulator including a DC bias circuit for applying a DC bias current to the inductor coil for regulating an electromagnetic field generated by the inductor.

The inductor may include a core of non-uniform permeability. The permeability of the core preferably decreases from a centre portion towards an outer periphery. The core may include a plurality of voids evenly spaced along or adjacent an outer periphery of the core. More preferably, the voids may be elongate slots along an axial direction of the core.

Preferably, the resonant circuit includes blocking means to isolate the inductor coil such that the DC bias current only flows through the inductor coil. In other words, the blocking means advantageously prevent the DC bias current from affecting components of the resonant circuit other than the inductor coil.

To this end, the resonant circuit may further include two or more capacitors. Typically, the capacitors are connected in series to the inductor coil. In particular, a capacitor may be coupled in series to each terminal of the inductor.

Preferably, the inductance to capacitance ratio (L/C ratio) for the resonant circuit is in the range 1000 to 1,000,000. The inductor may have an inductance in the region of 600 µH. The pair of capacitors may have a combined capacitance of approximately 3.3 nF.

A current sensing resistor may be connected in series with one of the capacitors to enable detection of current flow through the inductor.

The resonant circuit may be powered by any suitable power source. The resonant circuit may include an H-bridge for converting a DC signal from a DC power source to an AC signal for driving the resonant circuit. Alternatively, an AC signal from any suitable AC power source may be used to drive the resonant circuit.

The transmitter may further include a H-bridge controller for controlling a driving frequency for driving the resonant circuit. The H-bridge controller may be separate to, or integrated with, the H-bridge.

In this form of the invention, the capacitors operate as blocking capacitors for decoupling the DC bias current from the H-bridge and H-bridge controller.

With the blocking inductors decoupling the DC bias current source from AC signals of the inductor, the configuration of the blocking capacitors and inductors allows for effective decoupling of the main and bias signals, enabling the DC bias current circuit to be used to regulate the operation of the inductor without significantly affecting other circuitry components.

The operating frequency of the resonant circuit may be between 50 kHz and 150 kHz. Preferably, the operating frequency of the resonant circuit is approximately 125 kHz.

The transmitter may include a fault detection system for detecting a fault condition when a required DC bias current adjustment exceeds operational limits.

According to a further aspect of the invention, there is provided a proximity detection system including a transmitter as described above.

The proximity detection system can include a plurality of transmitters as required to accommodate a particular application. Similarly, the proximity detection system can include one or more receivers for detecting an electromagnetic field generated from a transmitter.

According to yet another aspect of the invention, there is provided a method of regulating a resonant circuit, the resonant circuit including an inductor coil, the method including the step of: applying a DC bias current to the inductor coil for regulating an electromagnetic field generated by the inductor.

The method may include the steps of:

setting the DC bias current to a predetermined value, measuring the response of a current flow in the resonant circuit to an incremental change in the DC bias current, and determining whether a change to the DC bias current is required to achieve a desired resonance point for the resonant circuit.

The method may include maintaining the DC bias current value in response to a determination that no change is required.

The method may include:

increasing the DC bias current if the current flow of the resonant circuit increases in response to an incremental increase in the DC bias current and/or decreases in response to an incremental decrease in the DC bias current, and decreasing the DC bias current if the current flow of the resonant circuit increases in response to an incremental decrease in the DC bias current and/or decreases in response to an incremental increase in the DC bias current.

The method may include adjusting the DC bias current by adjusting a Pulse Width Modulation (PWM) duty cycle of the DC bias current.

The DC bias current can be used to selectively change the inductance of the inductor in the resonant circuit so as to achieve and maintain a desired field strength. The variation in inductance is achieved without the need for an additional control winding, by directly superimposing the DC bias current on the resonant circuit inductor.

Reference throughout this specification to 'one embodiment' or 'an embodiment' means that a particular feature, structure, or characteristic described in connection with the embodiment is included in at least one embodiment of the present invention. Thus, the appearance of the phrases 'in one embodiment' or 'in an embodiment' in various places throughout this specification are not necessarily all referring to the same embodiment. Furthermore, the particular features, structures, or characteristic described herein may be combined in any suitable manner in one or more combinations.

BRIEF DESCRIPTION OF THE DRAWINGS

The invention will now be further explained and illustrated by reference to the accompanying drawings in which.

DETAILED DESCRIPTION OF THE DRAWINGS

Figure 1:
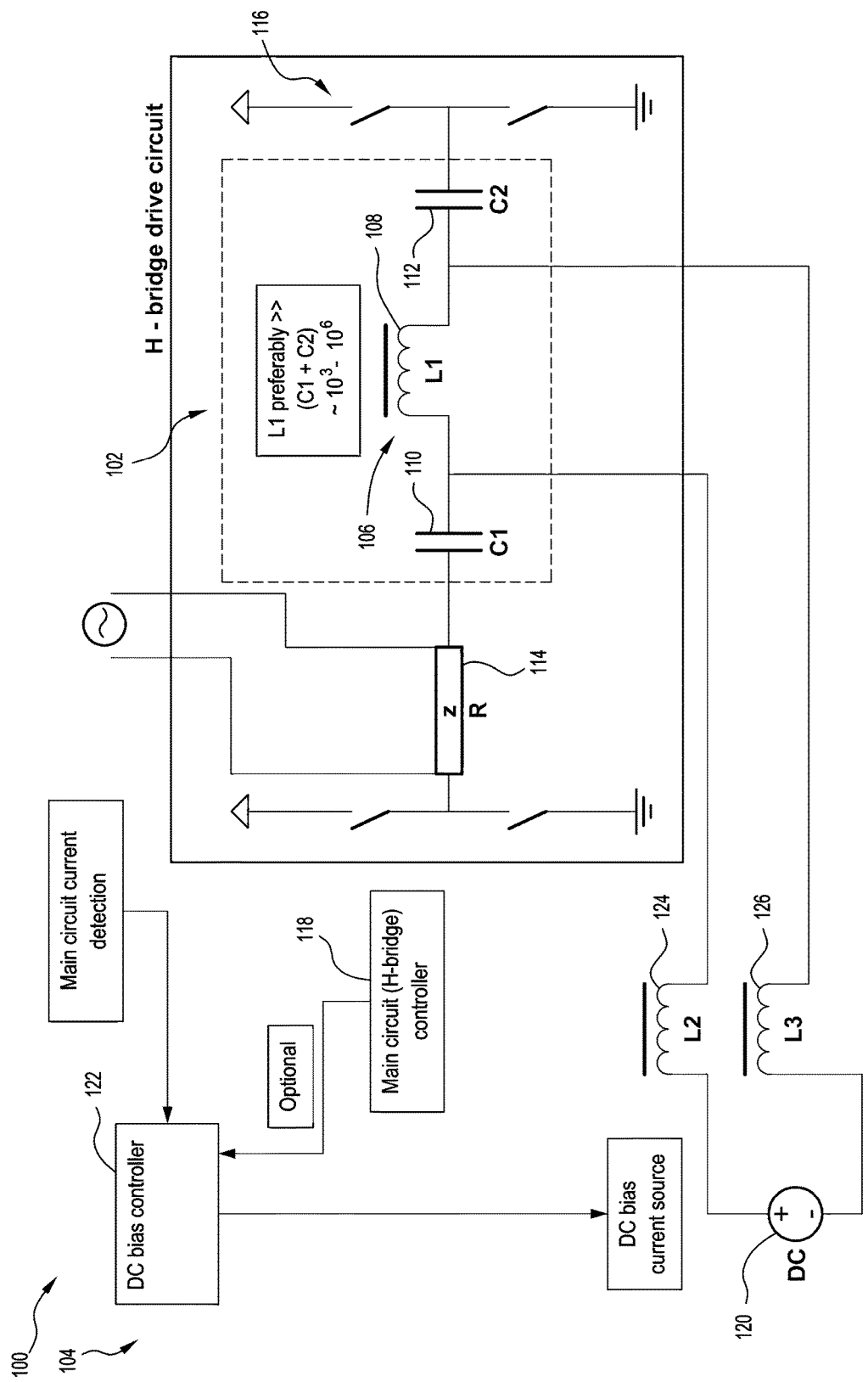
FIG. 1 is a schematic diagram of a transmitter according to an embodiment of the present invention.

The transmitter 100 of FIG. 1 forms part of a proximity detection system (not shown). During operation, the transmitter 100 generates an electromagnetic field for detection by one or more receivers (not shown) when the receivers are within range of the transmitter 100, allowing appropriate warning measures and/or collision avoidance measures.

The transmitter 100 includes a resonant circuit 102 and a field regulating circuit 104 (field regulator). The resonant circuit 102 includes an antenna 106 for generating the electromagnetic field during operation. The antenna 106 includes an inductor 108 having a cylindrical core of non-uniform permeability (not shown), and a single winding of inductor coil around the core. In particular, the core includes a plurality of axial elongate slots evenly spaced about an outer periphery of the core. The resonant circuit 102 also includes a pair of capacitors 110, 112. Each capacitor 110, 112 is coupled in series to an opposite terminal of the inductor 108 as shown.

The inductance to capacitance ratio (L/C) for the resonant circuit 102 is in the range 1000 to 1,000,000. In a circuit tested, the inductor 108 has an inductance of approximately 600 µH, and the pair of capacitors 112, 110 has a combined capacitance of approximately 3.3 nF. The specific inductance and capacitance values have been chosen to achieve a target resonant frequency of around 125 kHz.

The resonant circuit further includes a current sensing resistor 114 coupled in series with capacitor 110. The current sensing resistor 114 allows measurement of the current flow in the inductor coil 108 to provide feedback to the regulating circuit 104. Positioning the current sensing resistor 114 between an H-bridge 116 and capacitor 110 ensures that the sensing resistor 114 and the associated sensing circuitry are not subject to full resonance voltages across the inductor 108.

The H-bridge 116 of the resonant circuit 102 can be used to convert a DC signal from a DC power supply to an AC signal for driving the resonant circuit 102. Alternatively, the H-bridge 116 can be used to modulate the frequency of an AC power source if required, such that an AC drive signal at a selected operating frequency is applied to the resonant circuit 102.

It will be understood that, as an alternative to the H-bridge drive described herein, the resonant circuit may be driven by an AC signal from any other suitable AC power source.

The resonant circuit 102 further includes an H-bridge controller 118 for driving the H-bridge 116 at an appropriate driving frequency to generate the required AC signal. More particularly, the H-bridge controller 118 includes a microprocessor programmed to control a driving circuit, which drives the H-bridge at the desired driving frequency. As mentioned above, the operating frequency of the resonant circuit is typically around 125 kHz.

The field regulating circuit 104 includes a variable DC current source 120 for applying a DC bias current to the inductor coil 108 via a bias current circuit, in order to regulate the electromagnetic field generated by the antenna 106, as explained in further detail below.

Figure 4:
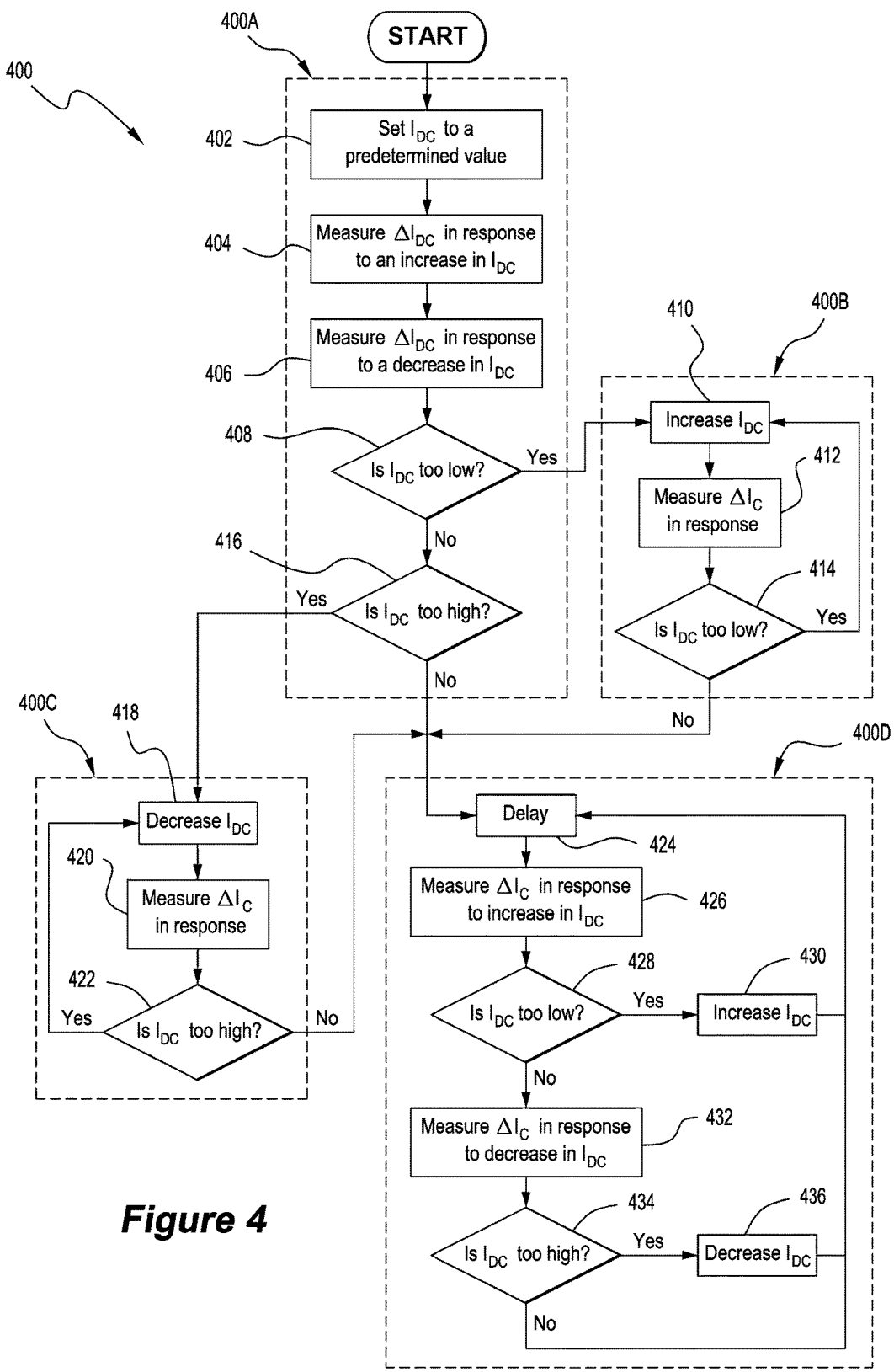
FIG. 4 is a flow diagram illustrating the operation of the regulating circuit of the transmitter of FIG. 1.

The field regulating circuit 104 further includes a DC bias controller 122 for controlling the level of DC bias current provided by the DC current source 120. The operation of the bias current controller 122 will be explained in further detail with reference to FIG. 4.

In addition, the field regulating circuit 104 includes a pair of inductors 124, 126 for decoupling the DC current source 120 from the high voltages of the resonant circuit 102. Each inductor 124, 126 is coupled in series to an opposite terminal of the DC current source 120 as shown in FIG. 1. The inductance value of each blocking inductor 124, 126 is typically at least an order of magnitude greater than that of inductor 108. This advantageously prevents detuning of the antenna 106 through the parallel blocking inductors 124, 126.

During operation of the transmitter 100, an input signal from the power supply is applied to the resonant circuit 102. The H-bridge controller 118 is configured to drive the H-bridge 116 at an appropriate switching frequency to convert the input signal to an AC signal having a driving frequency of approximately 125 kHz and an amplitude of 24V. Such an AC signal is selected to drive the resonant circuit to operate in a resonant mode to generate an electromagnetic field having a required field strength and range.

As the transmitter 100 is moved into proximity to other metallic objects, the strength of the electromagnetic field generated by the transmitter 100 can be affected.

In order to control the electromagnetic field the regulating circuit 104 applies a varying DC bias current through the inductor coil 108 so as to compensate for any changes in the electromagnetic field. The varying DC bias current is thus used to drive the resonant circuit 102 to operate as closely as possible to a resonance point under varying external conditions of operation.

In particular, the bias current controller 122 can detect a change in the electromagnetic field by detecting a change in the current flow through the inductor 108 as measured across the current sensing resistor 114 in response to an incremental change to the DC bias current. The bias current controller 122 then determines an appropriate DC bias current to be applied to the inductor coil 108 based on the detected change.

The capacitors 110, 112 are coupled in series to opposite terminals of the inductor coil 108 so as to isolate the H-bridge controller 118 from the DC bias current of the inductor 108. As previously mentioned, the inductors 124, 126 block the DC current source 120 from high voltage AC signals across the inductor 108. This solution provides effective decoupling of the main AC power signal and the DC bias signal so that the DC bias current can be used to regulate the performance of the antenna 106 without affecting operation of other circuitry components.

The DC bias current can therefore be applied to the inductor coil 108 to change the inductor core permeability and thus its inductance, thereby to change the natural frequency of the resonant circuit 102. By changing the natural frequency to closely match the drive frequency, a target resonant point for the resonant circuit 102 can be achieved and maintained so as to establish a consistent operation of the transmitter 100.

Figure 2:
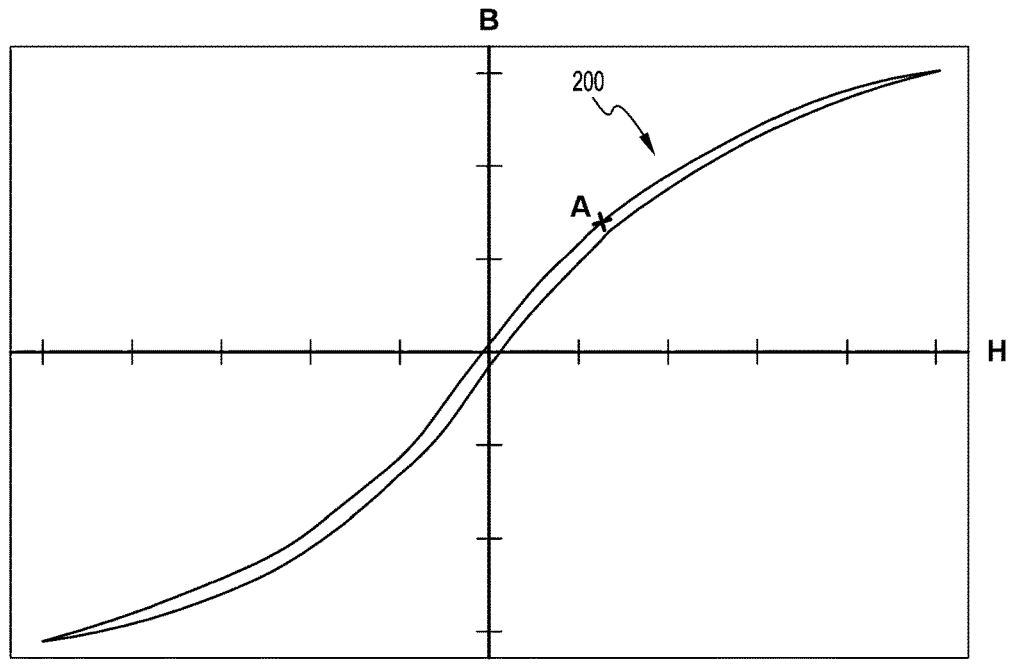
FIG. 2 is a B-H curve illustrating the relationship between an external magnetising field and the induced magnetic flux density of the field generating antenna of the transmitter of FIG. 1.

The B-H curve (hysteresis curve) 200 of FIG. 2 illustrates the relationship between an external magnetising field H applied to the antenna 106 and the induced magnetic flux density B of the antenna 106. The magnetic permeability of the inductor core, μ=B/H, is represented by the slope of the curve 200. As illustrated by the curve 200, an increase in the external magnetising field H applied to the antenna 106 causes an increase in the induced magnetic flux density B, until a state of saturation is reached.

For effective operation, an operating region having a changing slope on the curve 200 and away from saturation is selected. For example, an operating region around point A on the curve 200 is selected. At this operating region, the slope of the curve 200 can be changed by changing the external magnetising field H. In this manner, the magnetic permeability of the inductor 108 can be effectively changed by a change in the applied DC bias current.

In the device tested, the inductance and capacitance values of the transmitter 100 were selected such that the natural frequency of the resonant circuit 102 was as close as possible to the desired operating frequency of 125 kHz. The relationship between the natural frequency $f_n$, the inductance L and the capacitance C of the resonant circuit 102 can be expressed using formula (1) below:

$$f_n = \frac{1}{2\pi\sqrt{LC}} \quad (1)$$

An increase in the inductance L therefore causes a decrease in the natural frequency $f_n$ of the resonant circuit 102, and vice versa.

When the antenna 106 is operating at point A as shown in FIG. 2, an increase in the DC bias current has the effect of increasing the external magnetising field H, causing the operating point to shift slightly to the right side of point A. As the slope of the curve 200 decreases to the right of point A, the effective permeability μ also decreases, thereby causing a decrease in inductance L and an increase in the natural frequency $f_n$ of the resonant circuit 102.

Conversely, a decrease in the DC bias current has the effect of decreasing the external magnetising field H, causing the operating point of the inductor 108 to shift slightly to the left of point A. As the slope of the curve 200 increases to the left of point A, the effective permeability μ also increases, thereby causing an increase in inductance L and hence an decrease in the natural frequency $f_n$ of the resonant circuit 102.

Determination of the prevalent natural frequency relative to the driving frequency can be achieved by perturbing the DC bias current marginally about the current value, and comparing the change in current in the resonant circuit 102 in response to this tuning change.

Figure 3:
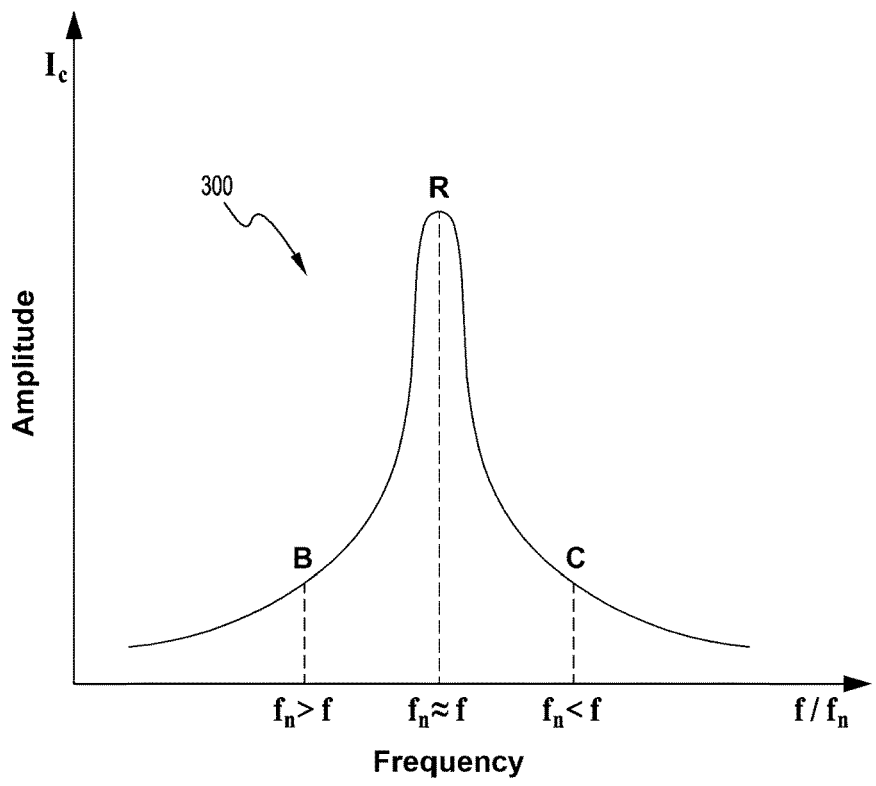
FIG. 3 is a response curve illustrating the relationship between the resonant circuit current amplitude and the natural frequency of the resonant circuit of the transmitter of FIG. 1.

As illustrated in the response curve 300 of FIG. 3, the horizontal axis represents the driving frequency, as the ratio between driving frequency f and the resonant frequency $f_n$ of the resonant circuit 102. A peak resonant current amplitude for the resonant circuit 102 is achieved at point R of the curve 300, where the resonant frequency $f_n$ is equal to the driving frequency f of the resonant circuit 102. In practice, the resonant peak current amplitude is achieved when the natural frequency $f_n$ is as close as practically possible to the driving frequency f of the resonant circuit 102, ie. $f \approx f_n$. When the resonant circuit 102 is operating at point B of the curve 300, the natural frequency $f_n$ is greater than the driving frequency f. When the resonant circuit 102 is operating at point C of the curve 300, the natural frequency $f_n$ is lower than the driving frequency f.

As previously discussed with reference to FIG. 2, an increase in the DC bias current will decrease the permeability and inductance L of the inductor 108, hence increasing the natural frequency $f_n$, of the resonant circuit 102. Conversely, a decrease in the DC bias current will decrease the natural frequency $f_n$ of the resonant circuit 102.

To determine whether the natural frequency $f_n$ of the resonant circuit 102 is lower, approximately equal to, or greater than the driving frequency f, a change in the current flow $I_c$ of the resonant circuit 102 in response to an incremental change in the input DC bias current is measured by the current sensing resistor 114.

If the resonant circuit 102 is operating at point B of the curve 300, the natural frequency $f_n$ is greater than the driving frequency f. When the input DC bias current is increased incrementally, the natural frequency $f_n$ also increases. At point B, an increase in the natural frequency $f_n$ will cause the operating point of the resonant circuit 102 to shift to the left side of point B, resulting in a corresponding decrease in the current $I_c$ of the resonant circuit 102. The reverse applies when the DC bias current is decreased incrementally. Therefore, if the current $I_c$ of the resonant circuit 102 decreases in response to an incremental increase to the DC bias current, and increases in response to an incremental decrease to the DC bias current, the resonant circuit 102 is operating to the left side of the resonant point R on the response curve 300, and the natural frequency $f_n$ is greater than the drive frequency f. The bias controller 122 therefore decreases the input DC current to decrease the natural frequency $f_n$ until the natural frequency $f_n$ closely matches the drive frequency.

Conversely, if the resonant circuit 102 is operating at point C of the curve 300, the natural frequency $f_n$ is lower than the driving frequency f. When the input DC bias current is increased incrementally, the natural frequency $f_n$ also increases. At point C, an increase in the natural frequency $f_n$ will cause the operating point of the resonant circuit 102 to shift to the left side of point C, resulting in a corresponding increase in the current $I_c$ of the resonant circuit 102. The reverse applies when the DC bias current is decreased incrementally. Therefore, if the current $I_c$ of the resonant circuit 102 increases in response to an incremental increase to the DC bias current, and decreases in response to an incremental decrease to the DC bias current, the resonant circuit 102 is operating to the right side of the resonant point R on the response curve 300, and the natural frequency $f_n$ is lower than the drive frequency f. The bias controller 122 therefore increases the input DC current to increase the natural frequency $f_n$ until the natural frequency $f_n$ closely matches the drive frequency.

In practice, the DC bias current is typically adjusted by adjusting the PWM duty cycle of the DC bias current. Moreover, the measurement of the current flow of the resonant circuit 102 is carried out by sampling the current $I_c$ at regular intervals and averaging the sampled values over a suitable period.

To allow effective adjustment of the natural frequency of the resonant circuit 102 about the desired operating frequency of 125 kHz, the zero bias resonance point of the resonant circuit 102 is initially set at a set point below 125 kHz, for example at about 5%-10% below 125 kHz.

As discussed above, during setup and operation, the natural frequency of the resonant circuit 102 and hence the strength of the electromagnetic field generated by the antenna 106 can be affected by, for example, metallic objects in the surrounding environment. The operation process 400 by which the regulating circuit 104 regulates the induced magnetic flux density B of the antenna 106 to compensate for the field changes will now be described with reference to FIG. 4.

At step 402, the bias current controller 122 sets the DC bias current provided by the DC current source 120 to a predetermined value. This predetermined value could be a factory setting or any suitable value as determined at initial setup. At the beginning of process 400, the current controller 122 initiates a sensing mode 400A in which the controller 122 determines the general region of the response curve 300 in which the resonant circuit 102 is operating (i.e. whether the natural frequency is higher, lower or generally equal to the drive frequency). The sensing mode 400A includes steps 402 to 416.

At step 404, the current sensing resistor 114 measures the resonant circuit current change ($\Delta I_c$) in response to an incremental increase in the DC bias current ($I_{DC}$).

At step 406, the current sensing resistor 114 measures the resonant circuit current change ($\Delta I_c$) in response to an incremental decrease in the DC bias current ($I_{DC}$).

At query step 408, the bias current controller 122 determines whether the DC bias current is too low. As previously discussed with reference to FIG. 3, an increase in $I_c$ in response to an incremental increase in $I_{DC}$ and a decrease in $I_c$ in response to an incremental decrease in $I_{DC}$ indicates that the natural frequency of the resonant circuit is lower than the drive frequency ($f_n<f$), and an increase in $I_{DC}$ is required to drive the natural frequency ($f_n$) closer to the drive frequency. If the DC bias current is too low, process 400 proceeds to step 410. If not, it proceeds to step 416.

At step 410, bias current controller 122 applies an incremental increase to the DC bias current. Typically, this is achieved by applying an incremental increase to the PWM duty cycle of the DC bias current, for example by 1%. At step 410, the controller 122 initiates the first adjustment mode 400B in which the DC bias current is increased until a resonant peak current amplitude is achieved for the resonant circuit 102. The first adjustment mode 400B includes method steps 410 to 414.

At step 412, the current sensing resistor 114 measures the resonant circuit current change ($\Delta I_c$) in response to the incremental increase in the DC bias current.

At query step 414, the bias current controller 122 determines whether the DC bias current is still too low. The DC bias current is too low if the resonant circuit current increases in response to an incremental increase in the DC bias current. Query step 414 is slightly different to query step 408 in that the current controller 122 already knows that the resonant circuit 102 is operating in the region in which the natural frequency ($f_n$) is lower than the drive frequency (i.e. towards the right side of the response curve 300 in FIG. 3). Accordingly, it is not necessary to also determine the change in resonant circuit current ($\Delta I_c$) in response to an incremental decrease in the DC bias current. If the DC bias current is too low, process 400 returns to step 410. If not, it proceeds to step 424.

At query step 416, the bias current controller 122 determines whether the DC bias current is too high. As previously discussed with reference to FIG. 3, an decrease in $I_c$ in response to an incremental increase in $I_{DC}$, and an increase in $I_c$ in response to an incremental decrease in $I_{DC}$ indicates that the natural frequency of the resonant circuit is higher than the drive frequency ($f_n>f$), and a decrease in $I_{DC}$ is required to drive the natural frequency ($f_n$) closer to the drive frequency. If the DC bias current is too high, process 400 proceeds to step 418. If not, it proceeds to step 424.

At step 418, bias current controller 122 applies an incremental decrease to the DC bias current. At step 418, controller 122 initiates a second adjustment mode 400C in which the DC bias current is decreased until a resonant peak current amplitude is achieved for the resonant circuit 102. The second adjustment mode 400C includes method steps 418 to 422.

At step 420, the current sensing resistor 114 measures the resonant circuit current change ($\Delta I_c$) in response to the incremental decrease in the DC bias current.

At query step 422, the bias current controller 122 determines whether the DC bias current is still too high. As explained, the DC bias current is too high if the resonant circuit current increases in response to an incremental decrease in the DC bias current. Query step 422 is slightly different to query step 416 in that the current controller 122 already knows that the resonant circuit 102 is operating in the region in which the natural frequency ($f_n$) is higher than the drive frequency (i.e. towards the left side of the response curve 300 in FIG. 3). Accordingly, it is not necessary to determine the change in resonant circuit current ($\Delta I_c$) in response to an incremental increase in the DC bias current. If the DC bias current is too high, process 400 returns to step 418. If not, it proceeds to step 424.

At step 424, a resonant current peak amplitude for the resonant circuit 102 has been achieved and the bias current controller 122 implements a delay for a suitable time period, for example 60 seconds. From step 424, the controller 122 initiates a tracking mode 400D in which the achieved resonant current peak amplitude is maintained by making suitable incremental adjustments to the DC bias current value. The reason for the delay is that in the tracking mode, the current controller 122 samples the resonant circuit current at a lower frequency than the sensing and adjustment modes 400A, 400B and 400C.

At step 426, the current sensing resistor 114 measures the resonant circuit current change ($\Delta I_c$) in response to the incremental increase in the DC bias current.

At query step 428, the bias current controller 122 determines whether the DC bias current is too low. The DC bias current is too low if the resonant circuit current increases in response to an incremental increase in the DC bias current. If the DC bias current is too low, process 400 proceeds to step 430. If not, it proceeds to step 432.

At step 430, the current controller 122 applies an incremental increase to the DC bias current.

At step 432, the current sensing resistor 114 measures the resonant circuit current change ($\Delta I_c$) in response to the incremental decrease in the DC bias current.

At query step 434, the bias current controller 122 determines whether the DC bias current is too high. The DC bias current is too high if the resonant circuit current increases in response to an incremental decrease in the DC bias current. If the DC bias current is too high, process 400 proceeds to step 436. If not, it returns to step 424.

At step 436, the current controller 122 applies an incremental decrease to the DC bias current.

A typically operational value for the DC bias current $I_{DC}$ can range from 50 mA to 2000 mA. In the embodiment described above, a typical current value for $I_{DC}$ is 350 to 400 mA.

Figure 5:
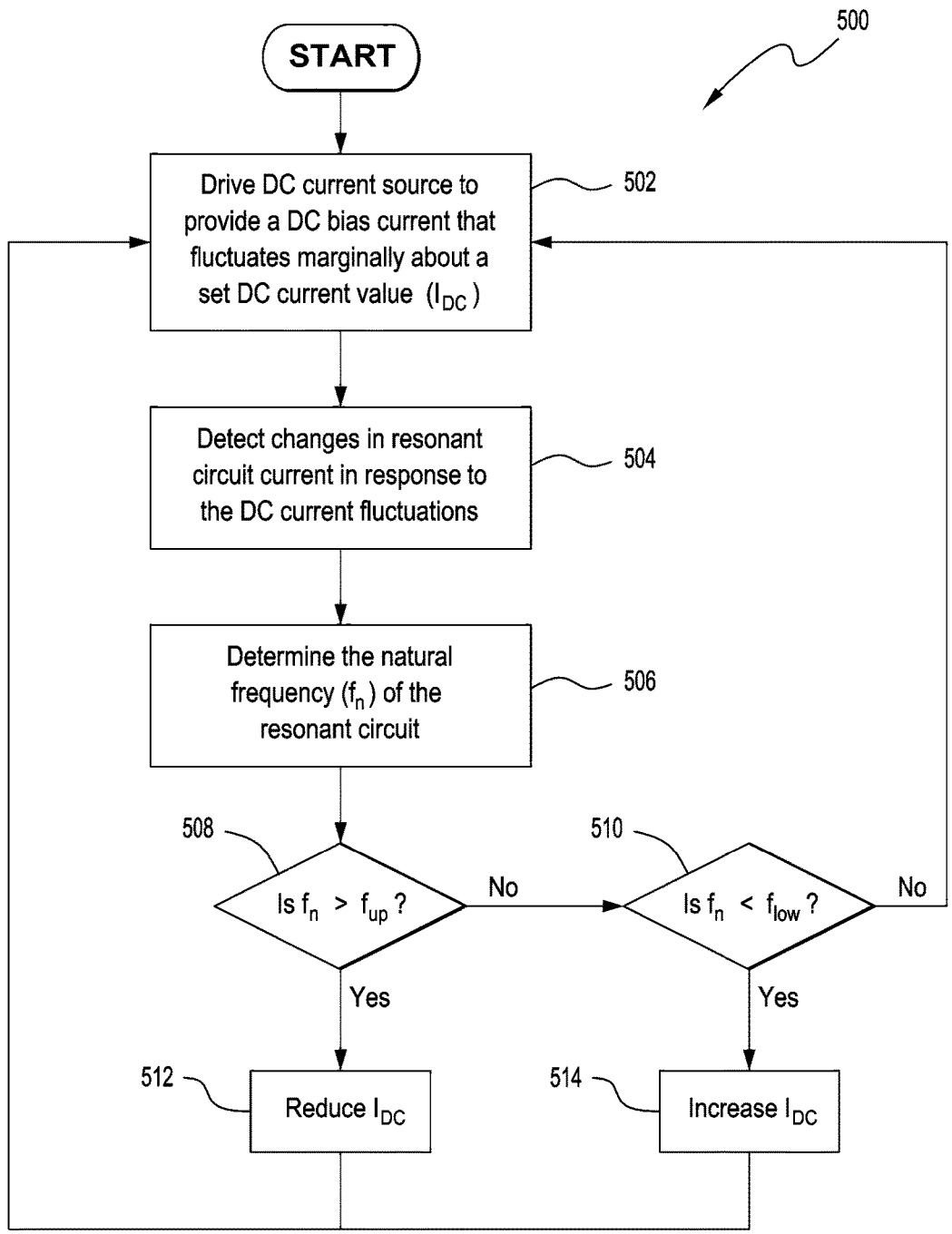
FIG. 5 is a flow diagram illustrating the operation of the regulating circuit according to another embodiment of the invention.

FIG. 5 illustrates an alternative operating process 500 in which the regulating circuit 104 controls the DC bias current to achieve the desired natural frequency of the resonant circuit.

At step 502, the bias current controller 122 drives the DC current source 120 to provide a DC bias current with a marginal fluctuation about a set current value $I_{DC}$.

At step 504, the change in the resonant circuit current in response to the DC bias current fluctuations are detected by way of the current sensing resistor 114.

At step 506, the bias current controller 122 determines or estimates the natural frequency $f_n$ of the resonant circuit 102 relative to the drive frequency based on the current change detected at step 504 in the manner as previously described.

At query step 508, the bias current controller 122 determines whether the natural frequency $f_n$ of the resonant circuit 102 is higher than an upper limit of a desired operating frequency range $f_{up}$, for example 130 kHz. If the natural frequency $f_n$ is higher than the upper limit $f_{up}$, process 500 proceeds to step 512. Alternatively, it proceeds to step 510. In one example, the natural frequency may be estimated by measuring the attenuation of the resonant circuit current amplitude at the operating point of the resonant circuit 102 on the response curve 300.

At query step 510, the bias current controller 122 determines whether the natural frequency $f_n$ of the resonant circuit 102 is lower than a lower limit of the desired operating frequency range $f_{low}$, for example 120 kHz. If the natural frequency $f_n$ is lower than the lower limit $f_{low}$, process 500 proceeds to step 514. Alternatively, it returns to step 502 without changing the set current value $I_{DC}$.

At step 512, the bias current controller 122 reduces the set current value $I_{DC}$ provided by the DC bias current source 120 by an incremental amount. As previously explained with reference to FIG. 2, a decrease in the DC bias current causes the natural frequency of the resonant circuit 102 to decrease.

At step 514, the bias current controller 122 increases the set current value $I_{DC}$ provided by the DC bias current source 120 by an incremental amount. As previously explained with reference to FIG. 2, an increase in the DC bias current causes the natural frequency of the resonant circuit 102 to also increase.

The field regulator 104 therefore provides a feedback control system configured to detect a change in the electromagnetic field generated by the resonant circuit 102 during operation by detecting a change in the resonant circuit current and then automatically compensate for the change by adjusting the DC bias current.

The field regulator 104 thereby provides a cost effective means to regulate the performance of the transmitter 100 without the need for manual calibration or additional components such as servomechanisms.

In addition, during initial setup of the proximity detection system, the transmitters are mounted to various vehicles, machinery and equipment of a work site. The metal of the vehicles, machinery and equipment can affect the resonant frequency of the respective resonant circuits 102. The field regulator 104 for each resonant circuit 102 automatically regulates the resonant frequency of the resonant circuit 102 after initial setup so that the strength and range of the electromagnetic field generated by each transmitter 100 can be maintained.

Moreover, the field regulator 104 can be used to assist the initial tuning process of the resonant circuit 102. During the initial tuning process, appropriate values must be determined for circuit capacitance and inductance to achieve a particular resonant frequency for the resonant circuit. In cases where the circuit inductance is relatively high (which is the case for the embodiment described above), the matching capacitors must have very low capacitance values (e.g. in the nF range). The tuning process involves selecting capacitors of standard value and manufacturing tolerance, and then combining them in series and parallel to achieve the desired total effective capacitance. At the same time, consideration must also be given to the requirements of low tolerance, high voltage, low temperature sensitivity, low series resistance, and low nominal value for the combination of capacitors. Accordingly, it can often be very difficult to achieve the appropriate circuit capacitance to match a specific circuit inductance for a target resonant frequency. A DC bias current provided by the field regulator of the invention can be used to alter the permeability and thus inductance of the resonant circuit such that an appropriate resonant frequency can be achieved even if it is not possible to achieve the exact circuit capacitance using available components.

Whilst the above example describes a field regulator 104 being used in relation to a transmitter 100 of a proximity detection system, a person skilled in the art will understand that the concept of the field regulator 104 may be used in other applications where it is desirable to tune and regulate the inductor characteristics of a resonant circuit (series or parallel), or generate and maintain oscillating magnetic or electric fields of a particular strength and range. Some examples include active filters, transmitters for public broadcast or point-to-point communication, metal or ore detection, carrier tracking with comparator and feedback control, generation of AM signals using resonance point de-tuning, and maintenance of a high SNR in FM transmission by tracking the instantaneous transmission frequency. Furthermore, the field regulator may be used in AM, VHF, HF and LF applications.

The word 'comprising' and forms of the word 'comprising' as used in this description do not limit the invention claimed to exclude any variants or additions.

Modifications and improvements to the invention will be readily apparent to those skilled in the art. Such modifications and improvements are intended to be within the scope of this invention.

What is claimed is:

1. A field regulator for a resonant circuit, the resonant circuit including an inductor coil around a core, the field regulator including:
   a DC bias circuit configured to apply a DC bias current to the inductor coil for regulating an electromagnetic field generated by the inductor;
   a feedback control system in which a level of the applied DC bias current is determined based on a current measured in the resonant circuit;
   a current detector for detecting a current flow of the resonant circuit; and
   a bias current controller for controlling the DC bias current based on the detected current flow of the resonant circuit.

2. The field regulator of claim 1, configured to adjust the DC bias current based on a resonant circuit response to an incremental change in the DC bias current.

3. The field regulator of claim 1, wherein the bias current controller is configured to adjust the DC bias current based on a detected change in the current flow of the resonant circuit in response to an incremental change in the DC bias current.

4. The field regulator of claim 1, wherein the current detector includes a current sensing resistor.

5. The field regulator of claim 1, wherein the current detector is configured to sample the current flow of the resonant circuit at regular intervals.

6. The field regulator of claim 1, wherein the bias current controller is coupled to a resonant circuit controller which controls an alternating power supply to said resonant circuit.

7. The field regulator according to claim 6, wherein the alternating power supply includes a H-bridge controller for controlling a driving frequency for driving the resonant circuit.

8. The field regulator of claim 1, wherein the DC bias current source is decoupled from high voltages of the resonant circuit.

9. A transmitter including:
   a resonant circuit including an inductor coil around a core;
   a field regulator including a DC bias circuit for applying a DC bias current to the inductor coil for regulating an electromagnetic field generated by the inductor;
   a feedback control system in which a level of the applied DC bias current is determined based on a current measured in the resonant circuit;
   a current detector for detecting a current flow of the resonant circuit; and
   a bias current controller for controlling the DC bias current based on the detected current flow of the resonant circuit.

10. The transmitter of claim 9, wherein the resonant circuit includes a blocking means to isolate the inductor coil such that the DC bias current only flows through the inductor coil.

11. The transmitter of claim 10, wherein the resonant circuit includes two or more capacitors connected in series to the inductor coil.

12. The transmitter according to claim 11, wherein a current sensing resistor is connected in series with one or more of the capacitors to enable detection of current flow through the inductor.

13. The transmitter of claim 9, wherein the resonant circuit includes an H-bridge for converting a DC signal from a DC power source to an AC signal for driving the resonant circuit.

14. A proximity detection system including the transmitter of claim 9.

15. A method of regulating a resonant circuit, the resonant circuit including an inductor coil, the method including the steps of:
   applying a DC bias current to the inductor coil for regulating an electromagnetic field generated by the inductor;
   setting the DC bias current to a predetermined value;
   measuring the response of a current flow in the resonant circuit to an incremental change in the DC bias current;
   determining whether a change to the DC bias current is required to achieve a desired resonance point for the resonant circuit; and
   in response to determining that the change to the DC bias current is required;
   adjusting the DC bias current, and
   applying the adjusted DC bias current to the inductor coil.

16. The method of claim 15, including the steps of:
   increasing the DC bias current if the current flow of the resonant circuit increases in response to an incremental increase in the DC bias current and/or decreases in response to an incremental decrease in the DC bias current; or
   decreasing the DC bias current if the current flow of the resonant circuit increases in response to an incremental decrease in the DC bias current and/or decreases in response to an incremental increase in the DC bias current.

17. The method of claim 15, wherein adjusting the DC bias current involves adjusting a Pulse Width Modulation (PWM) duty cycle of the DC bias current.

* * * * *